US008423317B2

(12) United States Patent
Kamezawa et al.

(10) Patent No.: US 8,423,317 B2
(45) Date of Patent: Apr. 16, 2013

(54) TEMPERATURE DETECTION METHOD OF SEMICONDUCTOR DEVICE AND POWER CONVERSION APPARATUS

(75) Inventors: Tomoya Kamezawa, Narashino (JP);
Naoki Takata, Narashino (JP);
Masayuki Hirota, Narashino (JP);
Masahiro Hiraga, Yotsukaidou (JP);
Satoshi Ibori, Yachimata (JP)

(73) Assignee: Hitachi Industrial Equipment Systems Co., Ltd., Chiba (JP)

( * ) Notice: Subject to any disclaimer, the term of this patent is extended or adjusted under 35 U.S.C. 154(b) by 391 days.

(21) Appl. No.: 11/036,012

(22) Filed: Jan. 18, 2005

(65) Prior Publication Data
US 2005/0197799 A1 Sep. 8, 2005

(30) Foreign Application Priority Data

Mar. 5, 2004 (JP) .............................. 2004-062568
Jul. 30, 2004 (JP) .............................. 2004-222738

(51) Int. Cl.
*G01K 11/00* (2006.01)
(52) U.S. Cl.
USPC ............. 702/130; 361/86; 327/538; 323/282
(58) Field of Classification Search .................. 702/130; 361/86; 327/538; 323/282
See application file for complete search history.

(56) References Cited

U.S. PATENT DOCUMENTS

| | | | | |
|---|---|---|---|---|
| 6,104,075 A | * | 8/2000 | Karaki | 257/467 |
| 6,441,395 B1 | * | 8/2002 | Yu et al. | 257/40 |
| 6,441,679 B1 | * | 8/2002 | Ohshima | 327/538 |
| 6,951,419 B2 | * | 10/2005 | Tsuchiya | 374/100 |
| 2003/0072117 A1 | * | 4/2003 | Maekawa et al. | 361/86 |

FOREIGN PATENT DOCUMENTS

| | | |
|---|---|---|
| CN | 1052401 A | 6/1991 |
| CN | 309661 | 7/1997 |
| CN | 1472877 A | 2/2004 |
| CN | 1778145 A | 5/2006 |
| DE | 197 08 653 A1 | 9/1998 |
| DE | 101 25 694 A1 | 1/2003 |
| JP | 03-283458 | 12/1991 |
| JP | 04-076943 | 3/1992 |
| JP | 05-102358 | 4/1993 |
| JP | 06-038259 | 5/1994 |
| JP | 07-014948 | 1/1995 |

(Continued)

OTHER PUBLICATIONS

Noriyasu, Terasawa, "Intelligent Power Module," JP 11-142254; Abstract.*

(Continued)

*Primary Examiner* — Sujoy Kundu
(74) *Attorney, Agent, or Firm* — Antonelli, Terry, Stout & Kraus, LLP.

(57) ABSTRACT

A temperature detection method for a semiconductor device and a power conversion apparatus are disclosed. A temperature detection device is used to detect the temperature for thermal protection of a power semiconductor device. The temperature detection device is placed in the proximity of a component having the power semiconductor device packaged therein, and either an emitter terminal or a collector terminal of the power semiconductor device. Since the temperature detection device is mounted on a circuit board, it does not require insulation from a cooling fin on which the power semiconductor device is mounted and lead wires can be eliminated.

6 Claims, 11 Drawing Sheets

FOREIGN PATENT DOCUMENTS

| | | |
|---|---|---|
| JP | 07-125938 | 5/1995 |
| JP | 11-142254 | 5/1999 |
| JP | 11-297461 | 10/1999 |
| JP | 2002-76236 | 3/2002 |
| JP | 2002-076256 | 3/2002 |
| JP | 2002-101668 | 4/2002 |
| JP | 2003-188336 | 7/2003 |

OTHER PUBLICATIONS

"Introduction to Insulated Gate Bipolar Transistors," Takesuye, Jack and Deuty, Scott. Motorola, 1995.*

European Search Report dated Mar. 18, 2008, issued in European Patent Application No. 05250229.

* cited by examiner

TEMPERATURE DETECTION METHOD OF SEMICONDUCTOR DEVICE AND POWER CONVERSION APPARATUS

INCORPORATION BY REFERENCE

The present application claims priorities from Japanese applications JP2004-062568 filed on Mar. 5, 2004, JP2004-222738 filed on Jul. 30, 2004 the contents of which are hereby incorporated by reference into this application.

BACKGROUND OF THE INVENTION

The present invention relates to a temperature detection technology of a semiconductor device, and in particular, to a temperature detection method of the semiconductor device used for a power conversion apparatus.

PRIOR ART

The temperature detection technology of the semiconductor device is described in patent documents 1, 2 and 3.
[Patent Document 1] JP-A-2002-101668
[Patent Document 2] JP-A-11-142254
[Patent Document 3] JP-A-2002-76236

BRIEF SUMMARY OF THE INVENTION

In general, there is a switching loss in a semiconductor device. For this reason, a power semiconductor device (semiconductor device for electric power) used for a power conversion apparatus such as an inverter involves considerable heat generation. Therefore, if excessive currents pass and cooling capacity cannot follow, temperature rises due to the heat generation so that, if left as-is, there is a possibility of exceeding allowable temperature and being destroyed by heat.

Thus, for the power conversion apparatus, it is usual to cope with it by providing a function of thermal protection in order to prevent the semiconductor device from being destroyed by overheating. For this purpose, it is necessary to detect the temperature of the semiconductor device.

Figure 5:
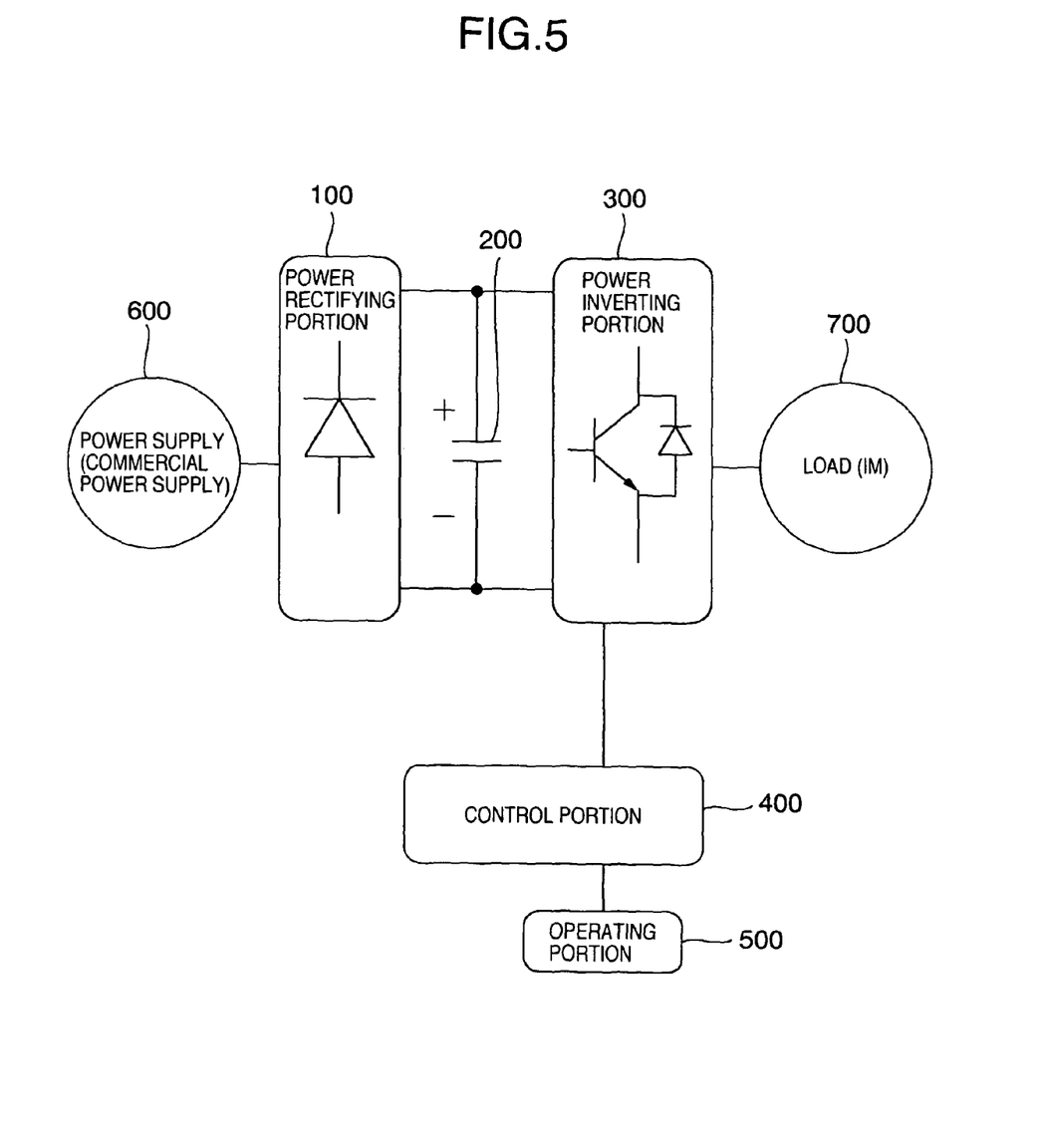
FIG. 5 is a block diagram showing an example of the power conversion apparatus.

Here, FIG. 5 shows a general configuration of an inverter apparatus as an example of the power conversion apparatus. In this case, the entire apparatus includes as main portions such blocks as a power rectifying portion 100 called a converter and a smoothing portion 200, a power inverting portion 300 called the inverter, a control portion 400 for controlling the power inverting portion 300, and an operating portion 500 for operating the power conversion apparatus via the control portion 400.

And three-phase AC power supplied from a power supply 600 such as a commercial power supply is converted to DC power by the power rectifying portion 100 consisting of a three-phase bridge diode circuit for instance, and the DC power from the power rectifying portion 100 is smoothed by the smoothing portion 200 consisting of an electrolytic capacitor for instance. Output power smoothed by the smoothing portion 200 is converted to three-phase AC power U, V, W of a desired frequency by the power inverting portion 300 so as to supply it to a load 700 such as an induction motor IM.

Figure 6:
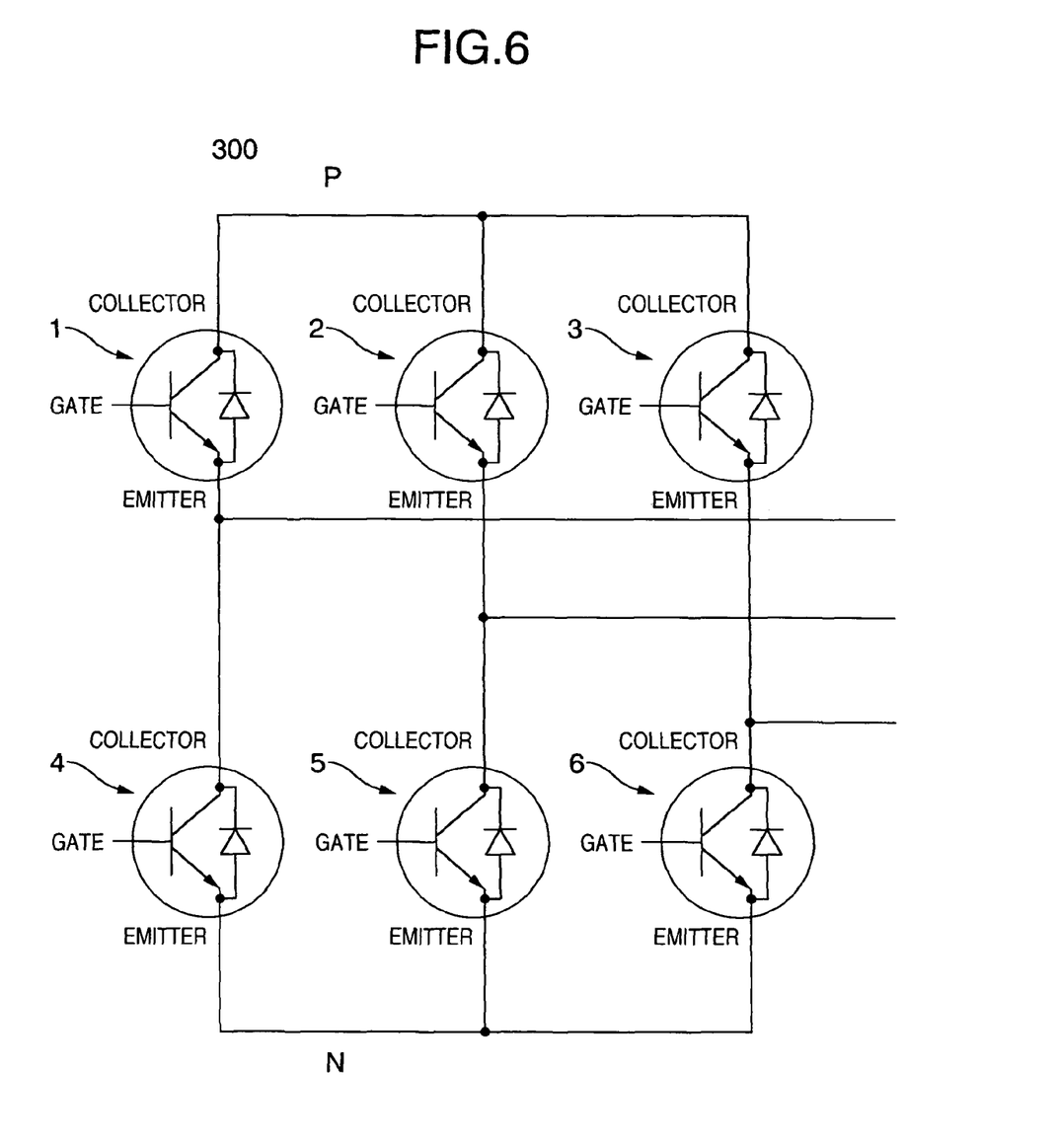
FIG. 6 is a circuit diagram showing an example of a power inverting portion of the power conversion apparatus.

Next, FIG. 6 is a detailed view of the power inverting portion 300 in the case of using IGBTs (insulated gate bipolar transistors) as the power semiconductor devices for instance. In FIG. 6, reference numerals 1 to 6 (1, 2, 3, 4, 5 and 6) denote the power semiconductor devices which consist of the IGBTs. As shown, they consist of the IGBTs and diodes (flywheel diodes) back-to-back connected thereto.

In this case, a DC++terminal P side of the power inverting portion 300 is called an upper arm and a −terminal N side there of is called a lower arm. Here, as for the power semiconductor devices 1 to 6 of each arm, the upper arm and lower arm are alternately switching-controlled by gate driving signals supplied from the control portion 400 so as to obtain power inverting operation.

And a current flowing from the +terminal P at this time passes to the load 700 through collectors of the power semiconductor devices 1 to 3 of the upper arm. As for the lower arm, it passes to the DC −terminal N from the collectors of the power semiconductor devices 4 to 6 through the emitter and the load 700.

Because of conduction of this current, each of the power semiconductor devices 1 to 6 has heat generated mainly at a junction between the collector and the emitter. Therefore, if the currents passing between the collectors and the emitters of the power semiconductor devices 1 to 6 become excessive for some reason, such as being in an overload state, the temperature of the power semiconductor devices rises so that there arises a possibility of destroying the devices in the case of exceeding a limit and destroying the power conversion apparatus itself in some cases.

Thus, as described above, the control portion 400 detects the temperature of the power semiconductor devices. And if the detected temperature reaches a predetermined temperature such as 80 degrees C., it shuts off energization of the power semiconductor devices and stops the heat generation of the power semiconductor devices to keep the temperature from rising so as to protect the power semiconductor devices and the power conversion apparatus.

In this case, it is also possible to provide temperature detection devices to a cooling fin on which the power semiconductor devices are placed and detect the temperature of the cooling fin so as to render it as a detected value of the temperature of the power semiconductor devices.

Figure 7:
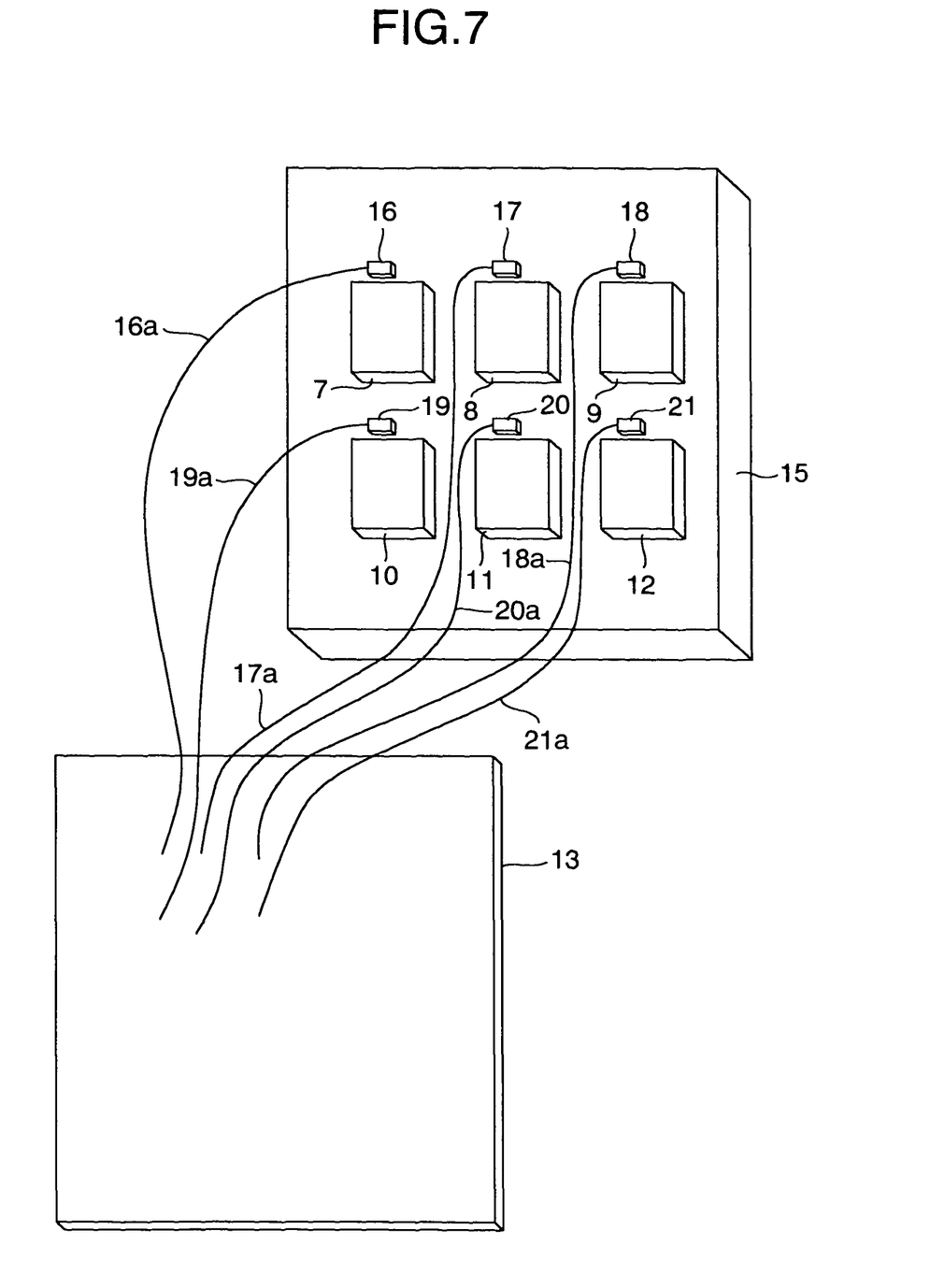
FIG. 7 is a block diagram showing an example of the power conversion apparatus.

FIG. 7 shows an example of placement of the power semiconductor devices. Here, components 7 to 12 (7, 8, 9, 10, 11 and 12) are equivalent to packages of the power semiconductor devices 1 to 6 (FIG. 6) respectively, and as shown in FIG. 7, they are mounted on a device mounting face of a cooling fin 15 in a desirable placement form. Connections to the components 7 to 12 are provided according to a circuit pattern formed on a circuit board 13, whereby the power inverting portion 300 is constituted.

FIG. 7 shows a state in which the circuit board 13 is separated from the cooling fin 15. In reality, however, the circuit board 13 is placed over the components 7 to 12, and is mounted on the cooling fin 15 as if to cover the device mounting face of the cooling fin 15.

As shown in FIG. 7, the device mounting face of the cooling fin 15 has temperature detection devices 16 to 21 placed thereon in the proximity to the components 7 to 12 consisting of the packages of the power semiconductor devices 1 to 6 respectively, and they are connected to the circuit board 13 by drawing out lead wires 16a to 21a respectively.

In this case, as for the desirable placement form on the device mounting face of the cooling fin 15, for example, the components 7, 8 and 9 of the power semiconductor devices 4, 5 and 6 of the lower arm are placed by arranging them sideways on the upper side, and the components 10, 11 and 12 of the power semiconductor devices 1, 2 and 3 of the upper arm are placed by arranging them sideways on the lower side so as to match with placement situation of the power semiconductor devices 1 to 6 in the circuit configuration in FIG. 6.

And in this case, it is possible to mount the cooling fin 15 on the power conversion apparatus proper by rendering the device mounting face thereof almost vertical when the power conversion apparatus is put in a state of use.

It is also possible, as for the power conversion apparatus using a module including the semiconductor devices, to have the temperature detection devices included in the module together and thereby detect the temperature.

The technology described above gives no consideration to the placement of the temperature detection devices, and has problems in miniaturizing the power conversion apparatus having the function of thermal protection and reducing prices.

As described above, in FIG. 7, the temperature detection devices are placed on the cooling fin near the packages of the power semiconductor devices. In this case, the cooling fin needs sufficient extra area to place the temperature detection devices thereon.

Furthermore, in this case, it is necessary to have a process for connecting the lead wires for the sake of taking out results of detection by the temperature detection devices and electrically insulating the temperature detection devices from the cooling fin. For this reason, it is difficult to miniaturize the power conversion apparatus and reduce the prices.

The patent document 3 discloses a semiconductor apparatus generally called the module.

Here, the module consists of an insulating substrate having a metal layer to which the semiconductor devices are firmly fixed. The module radiates heat generated by the semiconductor devices and so on to a radiating member such as the cooling fin outside by means of heat conduction. Therefore, the insulating substrate is characterized by using a member of good heat conduction such as alumina or ceramic. To be more specific, the heat of the semiconductor devices and so on is conducted to the radiating member such as the cooling fin by way of the metal layer, insulating substrate and so on so as to be radiated and cooled.

Thus, the patent document 3 constitutes it by mounting such as the semiconductor devices and peripheral devices thereof on the metal layer of the insulating substrate of good heat conduction.

As opposed to this, the present invention is not intended to provide the technology relating to temperature detection but targeting the so-called module. Or otherwise, it does not relate to the technology relating to the temperature detection targeting a circuit configuration portion using the insulating substrate of good heat conduction.

It is because, according to the patent document 3 and the other technology, the module becomes larger as a result of including the temperature detection devices in the module and besides, it also becomes larger since it requires extra terminals.

In addition, a housing, a case and so on for constituting the module are required separately. In particular, the insulating substrate of alumina or ceramic is generally expensive. For such reasons, using the module may involve an increase in the price including necessity to separately have the process for manufacturing the module. Therefore, there are the cases where, if the module is used, miniaturization becomes disadvantageous or price reduction becomes difficult.

An object of the present invention is to provide the temperature detection method of the semiconductor device and the power conversion apparatus suitable for the miniaturization.

The object is achieved by detecting the temperature of the semiconductor device used for the power inverting portion of the power conversion apparatus with the temperature detection device placed on the circuit board to which the terminal for the junction of the semiconductor device is connected. Or else, it is achieved by detecting the temperature of the semiconductor device used for the power inverting portion of the power conversion apparatus with the temperature detection device placed in the proximity to the terminal for the junction of the semiconductor device.

In this case, the object is also achieved by rendering the above described terminal as one of an emitter terminal and a collector terminal of the above described semiconductor device. Likewise, the object is also achieved by having a number of the above described semiconductor devices and placing the above described temperature detection device at one of the emitter terminal and collector terminal of the semiconductor device of which temperature increases in the number of the semiconductor devices.

The object is also achieved by, in the power conversion apparatus with detecting the temperature of the semiconductor device used for the power inverting portion, detecting the temperature of the above described semiconductor device with the temperature detection device placed on the circuit board to which the terminal for the junction of the above described semiconductor devices is connected. Or else, it is also achieved by detecting the temperature of the above described semiconductor device with the temperature detection device placed in the proximity to the terminal for the junction of the semiconductor devices.

In this case, the object is also achieved by rendering the above described terminal as one of the emitter terminal and collector terminal of the above described semiconductor device. The object is also achieved by having a number of the above described semiconductor devices and placing the above described temperature detection device at one of the emitter terminal and collector terminal of the semiconductor device of which temperature increases in the number of the semiconductor devices. Furthermore, the object is also achieved by having the above described temperature detection device placed on the circuit board used to connect the above described semiconductor devices.

Regarding the placement of the temperature detection device in the case of a number of the semiconductor devices, it does not always have to be placed in the proximity to the semiconductor device of the largest temperature rise among them.

It is possible, however, to obtain a more desirable effect of the function of thermal protection by placing the temperature detection device in the proximity to the semiconductor device of which the temperature rise is largest or the semiconductor device of which temperature rise is relatively large among the number of the semiconductor devices.

According to the above means, the temperature detection device intended to detect the temperature for the sake of preventing destruction of the semiconductor device is placed in the proximity to the emitter terminal and collector terminal of the power semiconductor device for instance.

In this case, the above described temperature detection device can be directly placed on the circuit board on which the power semiconductor device is mounted. Therefore, there is no need to insulate it electrically from the cooling fin on which the power semiconductor device is placed so that man-hours for wiring can be reduced.

According to the present invention, it is possible to further miniaturize the power conversion apparatus.

Other objects, features and advantages of the invention will become apparent from the following description of the embodiments of the invention taken in conjunction with the accompanying drawings.

DETAILED DESCRIPTION OF THE INVENTION

Hereunder, a detailed description will be given by referring to embodiments shown in the drawings as to a temperature detection method of a semiconductor device and a power conversion apparatus having a function of temperature detection according to the present invention.

Figure 1:
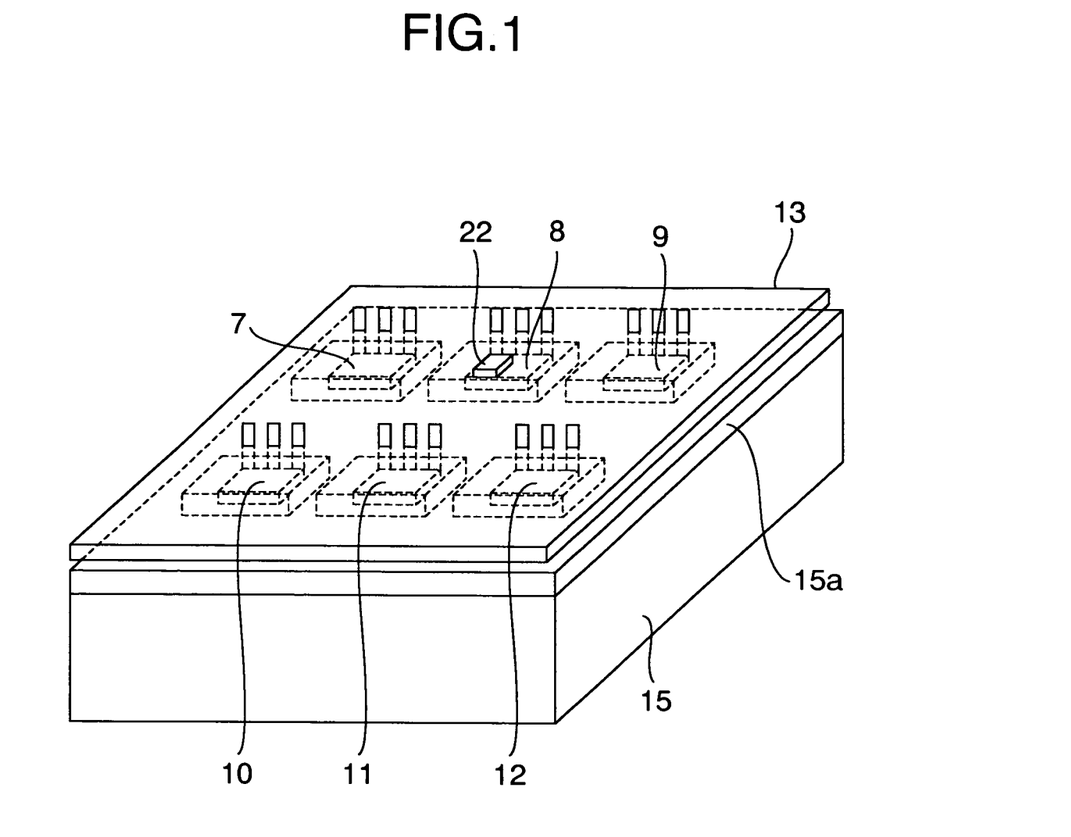
FIG. 1 is a block diagram showing an embodiment of a power conversion apparatus having a temperature detection method and a temperature detection function of a semiconductor device according to the present invention.
Figure 9:
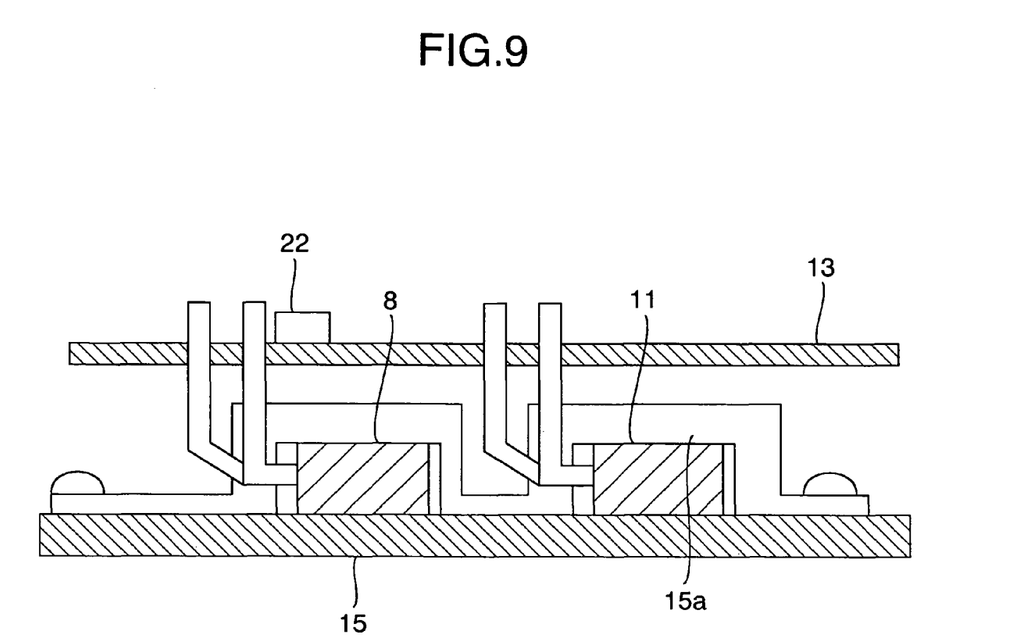
FIG. 9 is a sectional view of FIG. 1.

FIG. 1 shows an embodiment of the present invention. In FIG. 1, reference numeral 22 denotes a temperature detection device, and other components are the same as those of the technology described in FIG. 7 wherein components 7 to 12 consisting of packages of power semiconductor devices 1 to 6 are placed on a cooling fin 15 and a circuit board 13 is mounted thereon. FIG. 9 is a sectional view of FIG. 1, and represents a section passing through the components 8 and 11. The components 7 to 12 are put on the cooling fin 15 and are fixed thereon with a plastic case 15a. The circuit board 13 is mounted on topside thereof, and terminals of the components 7 to 12 are soldered thereon. A temperature detection device 22 is a chip-like component, and is soldered on the circuit board 13. In FIGS. 1 and 9, the temperature detection device 22 is mounted on the topside of the circuit board 13. However, it may also be mounted on the underside of the circuit board 13. Furthermore, the plastic case 15a has a role of pressing the components 7 to 12 against the cooling fin 15. However, it is possible to do without the plastic case 15a by fixing the components 7 to 12 on the cooling fin with screws for instance.

In this case, a thermistor (registered trademark) is used for the temperature detection device 22 by way of example. Otherwise, the entire configuration is the same as the technology shown in FIG. 5, and circuit configuration of a power inverting portion 300 is also the same as the technology shown in FIG. 6.

Figure 2:
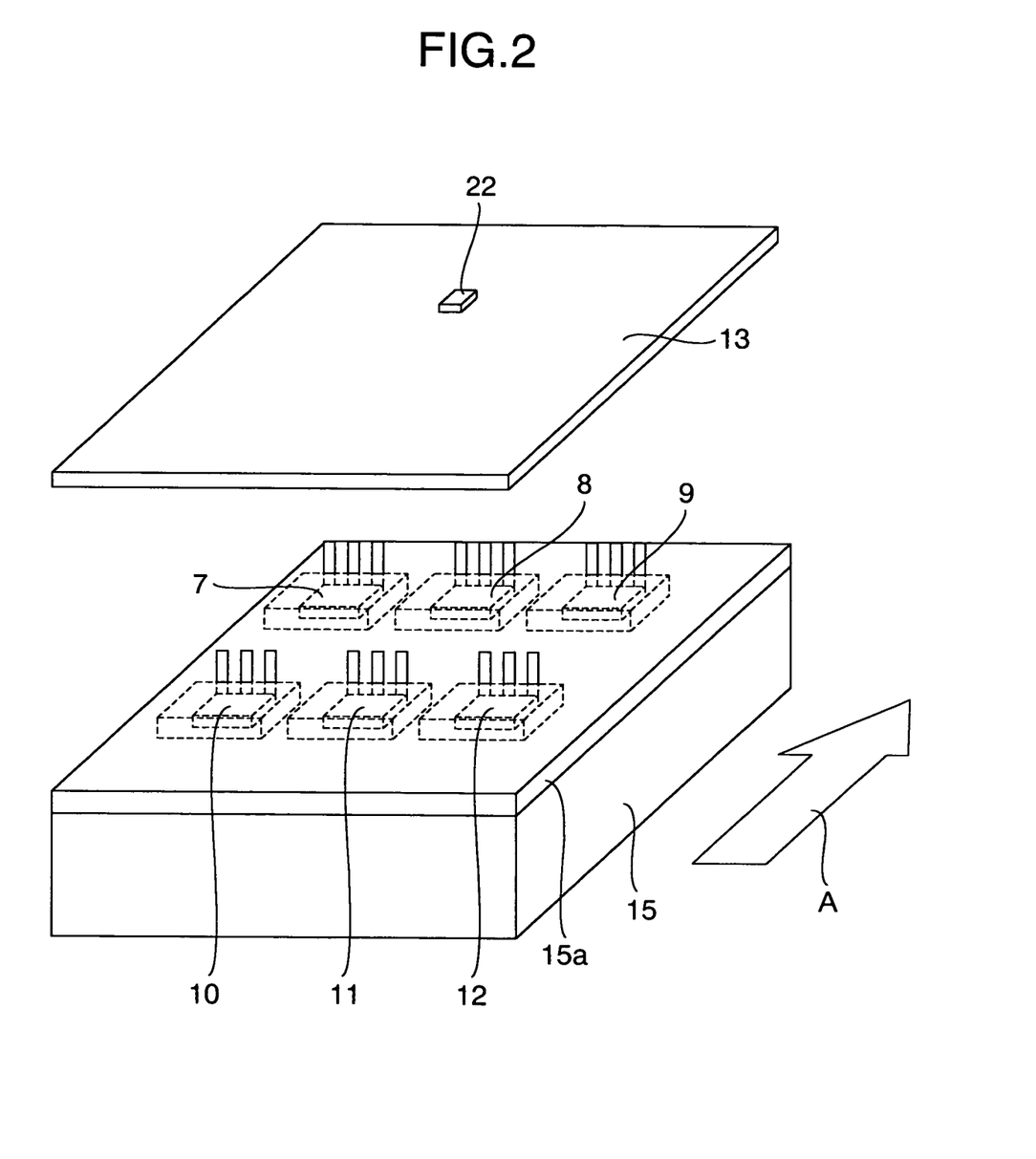
FIG. 2 is an exploded view showing an embodiment of the present invention.

According to this embodiment in FIG. 1, however, the temperature detection device 22 is not mounted on the cooling fin 15 but on the circuit board 13 as shown in FIG. 2. Therefore, it is different from the one mounted on the cooling fin 15 in this regard. Here, FIG. 2 shows a state of separating the circuit board 13 from the cooling fin 15 as in FIG. 7 described above.

Furthermore, according to this embodiment, the temperature detection device 22 is the only temperature detection device, which is only one. Therefore, it is also different from the case of providing six temperature detection devices to the power semiconductor devices 1 to 6 respectively. However, it is not intended to limit the temperature detection device to only one, and so the intent of the embodiment according to the present invention remains unchanged even if a number of them are provided to each of the power semiconductor devices for instance.

As shown in FIG. 1, when combining the circuit board 13 with the cooling fin 15, the one temperature detection device 22 is mounted on a face of the circuit board 13 having a circuit pattern formed thereon so as to be located in the proximity to an emitter terminal or a collector terminal of the power semiconductor device 5 (refer to FIG. 6) packaged in the component 8 at the center on the topside in FIG. 1 and also in the proximity to the circuit pattern to which these terminals are connected.

Thus, a control portion 400 detects the temperature of the temperature detection device 22 by means of a signal taken from the temperature detection device 22, and renders gates of all the power semiconductor devices 1 to 6 off when the detected temperature reaches a predetermined temperature for determination such as 80 degrees C. so as to interrupt the energization between the collector and emitter of each individual device.

As a result of this, heat generation of the power semiconductor devices 1 to 6 is stopped, and so the temperature rise of each of the power semiconductor devices 1 to 6 is curbed thereafter so as to obtain thermal protection of the power semiconductor devices and the entire power conversion apparatus. Here, a description will be given next as to the reason why this embodiment allows the thermal protection to be obtained as to all the power semiconductor devices 1 to 6 and the entire power conversion apparatus without mounting the temperature detection device 22 on the cooling fin 15 and by means of the only one temperature detection device 22.

First, in the case where the power semiconductor devices are packaged in a three-terminal discrete component for instance, the collector terminal is directly connected to a junction and so heat conduction is significant. The emitter terminal is also connected to a position very close to the junction and so the heat conduction is significant. Therefore, the heat generated by the junction is efficiently conducted to the outside of the package. As for the aforementioned technology, the heat generated by the power semiconductor devices is conducted to the cooling fin by way of a sealant between the junction of the power semiconductor devices and the cooling fin for instance, and then the temperature of the heated cooling fin is detected by the temperature detection device. Therefore, thermal resistance from the power semiconductor devices to the temperature detection device by way of the sealant and cooling fin is higher than that in the embodiment of the present invention. According to the embodiment of the present invention, the heat generated by the junction of the power semiconductor devices is conducted to the terminals thereof, and is further conducted to a wiring pattern on the circuit board on which the terminals are soldered so that the temperature of the wiring pattern should be detected. The thermal resistance from the power semiconductor devices to the temperature detection device by way of the terminals and wiring pattern is lower than that in the conventional cases. Therefore, the thermal resistance up to the temperature detection device according to the embodiment of the present invention is lower than that in the conventional cases, and it is thus possible to detect the temperature rise of the power semiconductor devices earlier than the conventional cases. Consequently, the embodiment of the present invention can perform protecting operation against the temperature rise of the power semiconductor devices earlier than the conventional cases.

And the heat thus efficiently led outside by the terminals connected to the circuit pattern of the circuit board 13 is conducted to the circuit pattern so as to locally increase the temperature of the circuit board 13.

Thus, even if the temperature detection device 22 is mounted on the circuit board 13, it should be located in the proximity to the emitter terminal or the collector terminal of the power semiconductor device 5 (refer to FIG. 6) and also in the proximity to the circuit pattern to which these terminals are connected. It is thereby possible to detect the temperature earlier than the case of mounting the temperature detection device 22 on the cooling fin 15.

Next, according to this embodiment, the cooling fin 15 is mounted on the power conversion apparatus proper so that a device mounting face of the power conversion apparatus becomes almost vertical when the power conversion apparatus is put in a state of use.

Then, as in this embodiment, in the case where the device mounting face of the cooling fin 15 has the components 7, 8 and 9 of the power semiconductor devices 4, 5 and 6 of the lower arm arranged sideways on the upper side and the components 10, 11 and 12 of the power semiconductor devices 1, 2 and 3 of the upper arm arranged sideways on the lower side placed thereon, the temperature of the cooling fin 15 due to the heat generation of the devices further rises upward as indicated by an arrow A.

In this case, all the power semiconductor devices 1 to 6 generate heat similarly. Therefore, the heat is concentrated on the center of the cooling fin 15 and the temperature rises so that the temperature of the power semiconductor device 5, that is, the component 8 located on the upper side of the center of the cooling fin 15 becomes the highest.

According to this embodiment, the temperature detection device 22 is placed in the proximity to the power semiconductor device 5, that is, the component 8. Therefore, the temperature detection device 22 detects the temperature of the power semiconductor device 5 of which temperature becomes the highest of the six power semiconductor devices 1 to 6. Even in the case where the temperature of the component 8 cannot be detected due to some condition, it is possible to presume the temperature of the power semiconductor device 5 that becomes the highest when a relation between the temperature around the component 8 and the temperature of the device actually detectable is known.

Here, it goes without saying that, for the sake of thermal protection, the function of protection should be performed when the temperature of the device of the highest temperature in a number of the power semiconductor devices mounted on the same cooling fin reaches the temperature requiring the thermal protection.

Therefore, according to this embodiment, it is possible to obtain the thermal protection of all the power semiconductor devices 1 to 6 and the entire power conversion apparatus without mounting the temperature detection device 22 on the cooling fin 15 and by means of the only one temperature detection device 22. This embodiment has been described as having only one temperature detection device. However, it is not intended to limit the number of the temperature detection devices. The intent of the present invention remains unchanged even if the number of the temperature detection devices is increased.

And as a result of this, according to this embodiment, it is not necessary to place the six temperature detection devices 16 to 21 on the cooling fin 15. Therefore, it is possible to reduce the man-hours required for the placement thereof and the man-hours required for wiring the temperature detection devices and also reduce the components required for the above described wiring such as an electric wire.

Next, to describe the placement of the temperature detection device 22 according to this embodiment more specifically, it should be placed in the proximity to the component 8 having the power semiconductor device 5 most significantly influenced by the temperature rise of the other power semiconductor devices packaged therein on the circuit board 13.

Here, the reason for placing the temperature detection device 22 in the proximity to the power semiconductor device of which temperature is to be detected is to detect the temperature of the junction of the device. Therefore, it has been described as to be placed in the proximity to the power semiconductor device, however, it is preferable to be placed in the proximity to the collector terminal or the emitter terminal.

Figure 3:
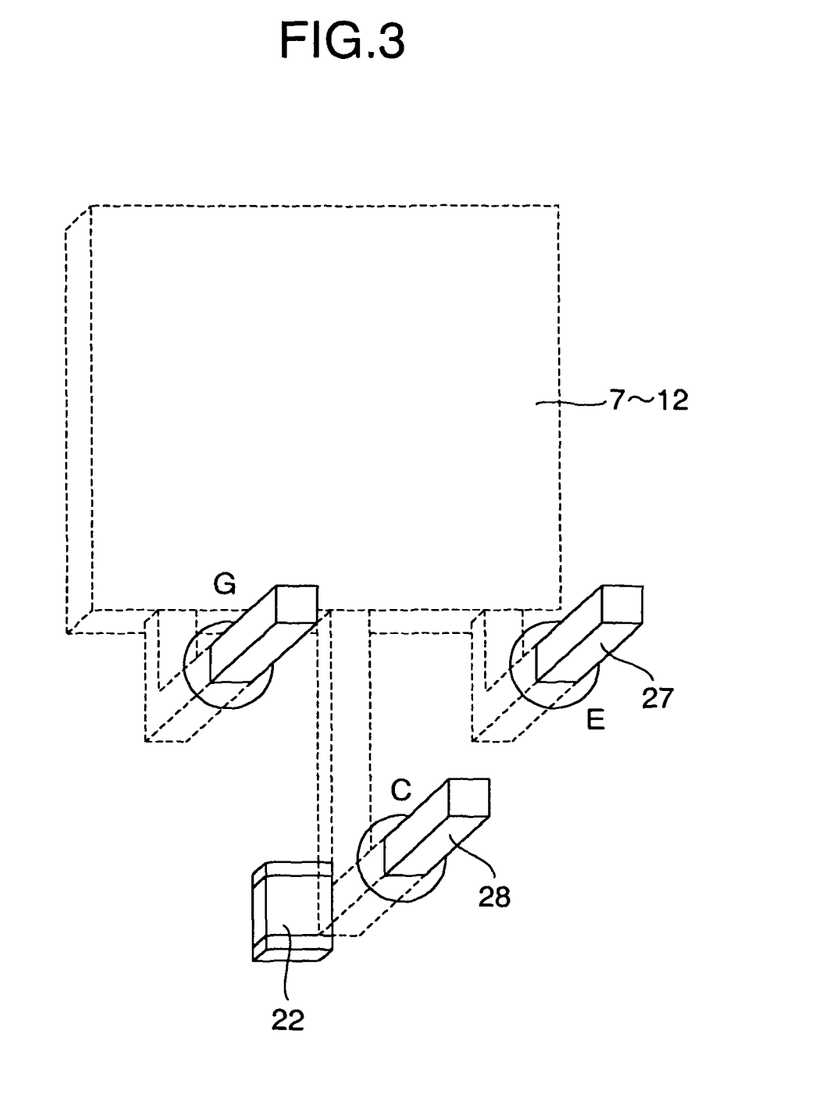
FIG. 3 is a schematic diagram showing an example of placement of a temperature detection device against a power semiconductor device according to an embodiment of the present invention.
Figure 4:
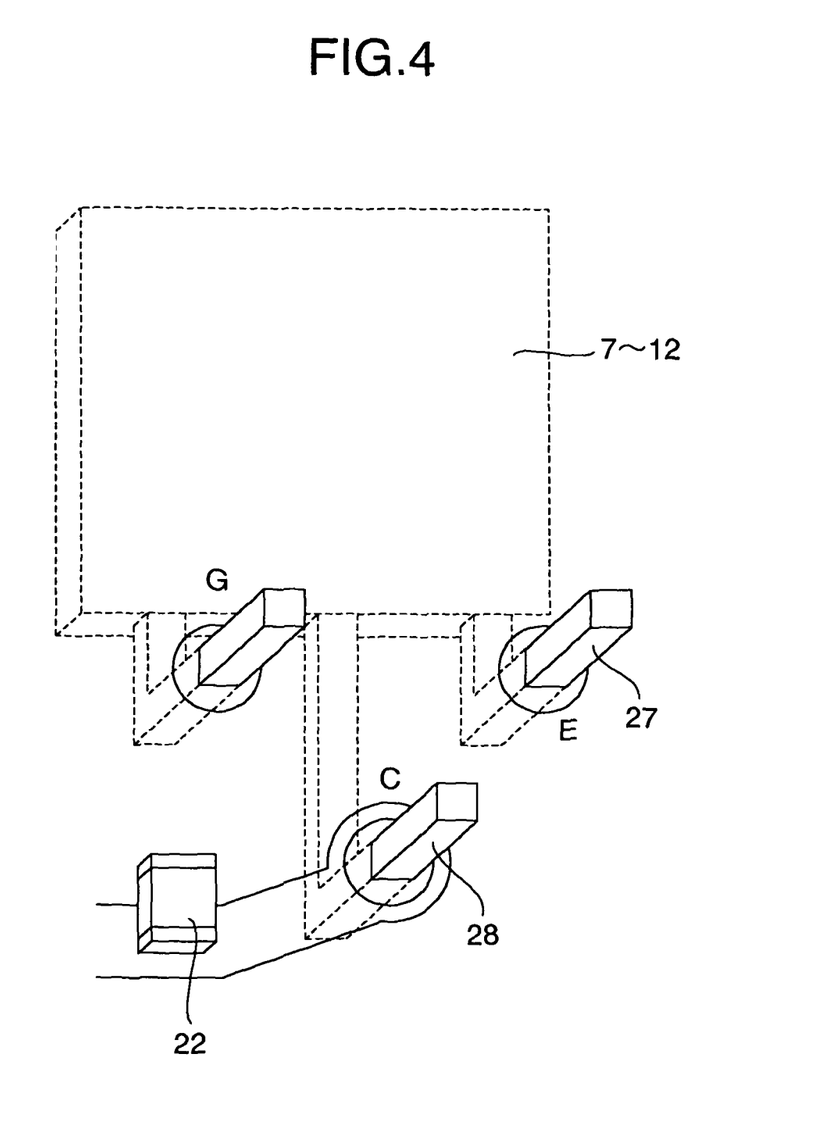
FIG. 4 is a schematic diagram showing another example of the placement of the temperature detection device against the power semiconductor device according to an embodiment of the present invention.
Figure 10:
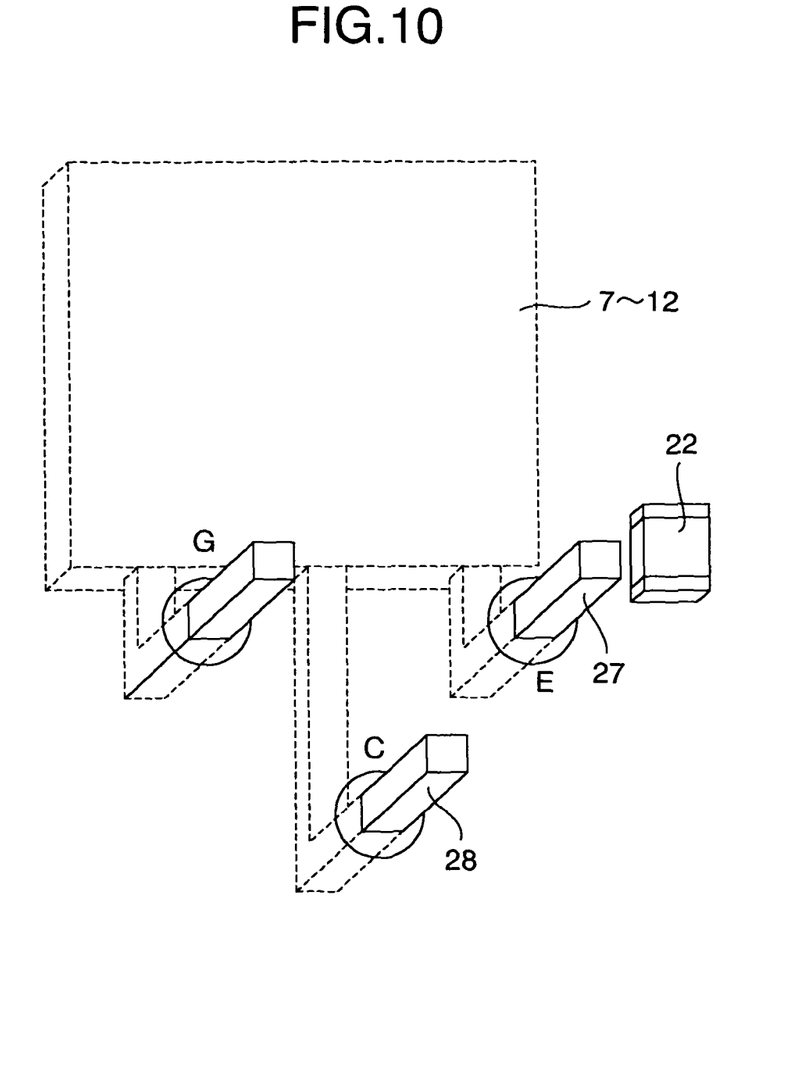
FIG. 10 is a schematic diagram showing an example of the placement of the temperature detection device against the power semiconductor device according to an embodiment of the present invention.
Figure 11:
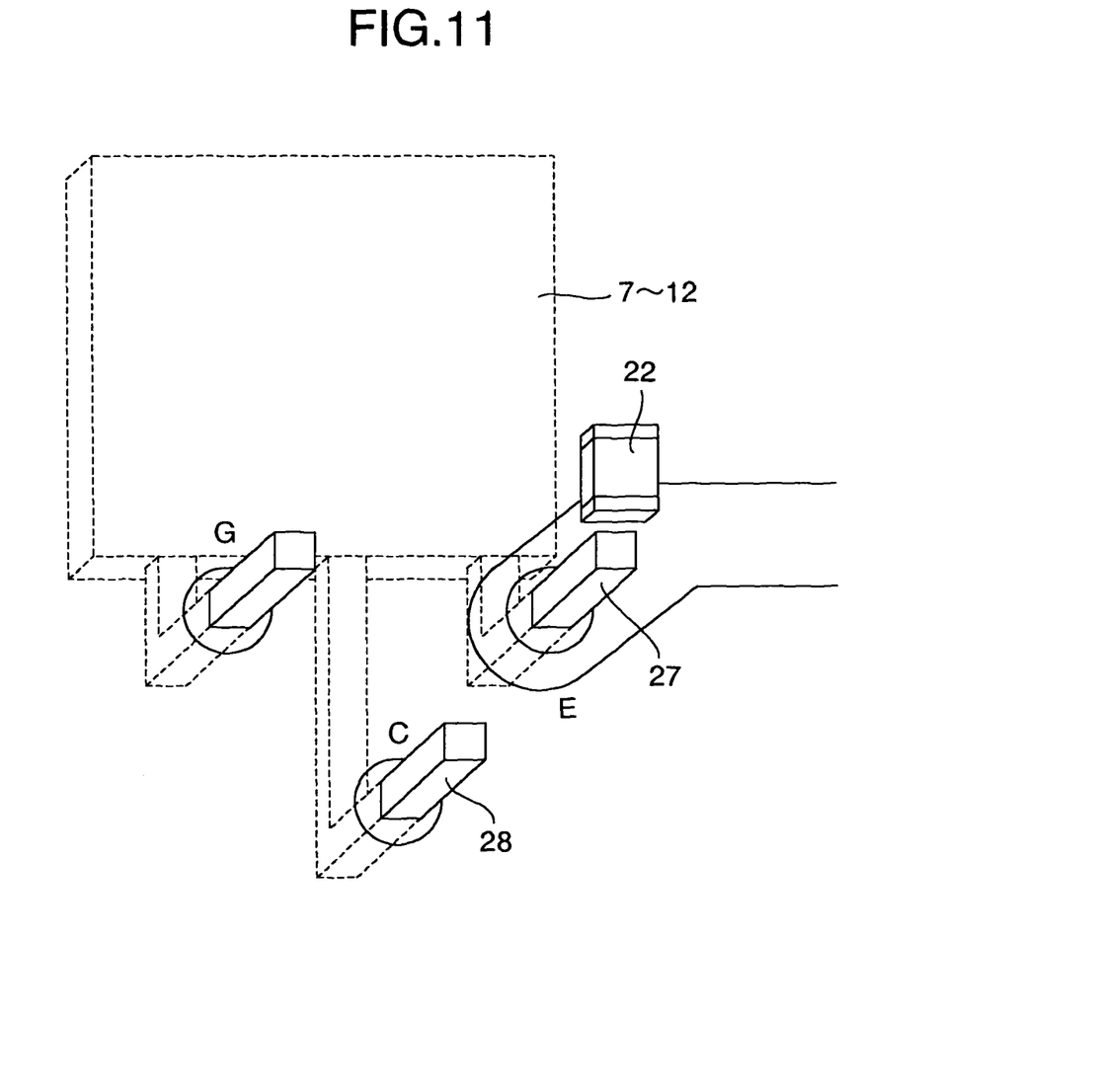
FIG. 11 is a schematic diagram for describing an example of the placement of the temperature detection device against the power semiconductor device according to an embodiment of the present invention.

FIGS. 10 and 11 show examples of the cases of placing the temperature detection device 22 in the proximity to an emitter terminal 27 of the power semiconductor devices 1, 2, 3, 4, 5 and 6 (components 10, 11, 12, 7, 8 and 9) respectively. It is possible to place the temperature detection device 22 in the proximity to the emitter terminal 27 irrespective of the wiring around the emitter terminal 27 as in FIG. 10. It is also possible to solder the temperature detection device 22 directly on a pattern wiring on the circuit board in the proximity to and connected to the emitter terminal 27 as in FIG. 11. Next, FIGS. 3 and 4 show examples of the cases of placing the temperature detection device 22 in the proximity to a collector terminal 28 of the power semiconductor devices 1, 2, 3, 4, 5 and 6 (components 10, 11, 12, 7, 8 and 9). It is possible to place the temperature detection device 22 in the proximity to the collector terminal 28 irrespective of the wiring around the collector terminal 28 as in FIG. 3. It is also possible to solder the temperature detection device 22 directly on the circuit board wiring pattern in the proximity to and connected to the collector terminal 28.

The detection signal of the temperature detection device 22 is taken by the control portion 400 where it is used for thermal protection operation. In this case, the control portion 400 uses the same electric potential as the power inverting portion 300 as a reference, and so a detection result of the temperature detection device 22 needs to be inputted to the control portion 400 as the signal of which reference is the same electric potential as the control portion 400.

Figure 8:
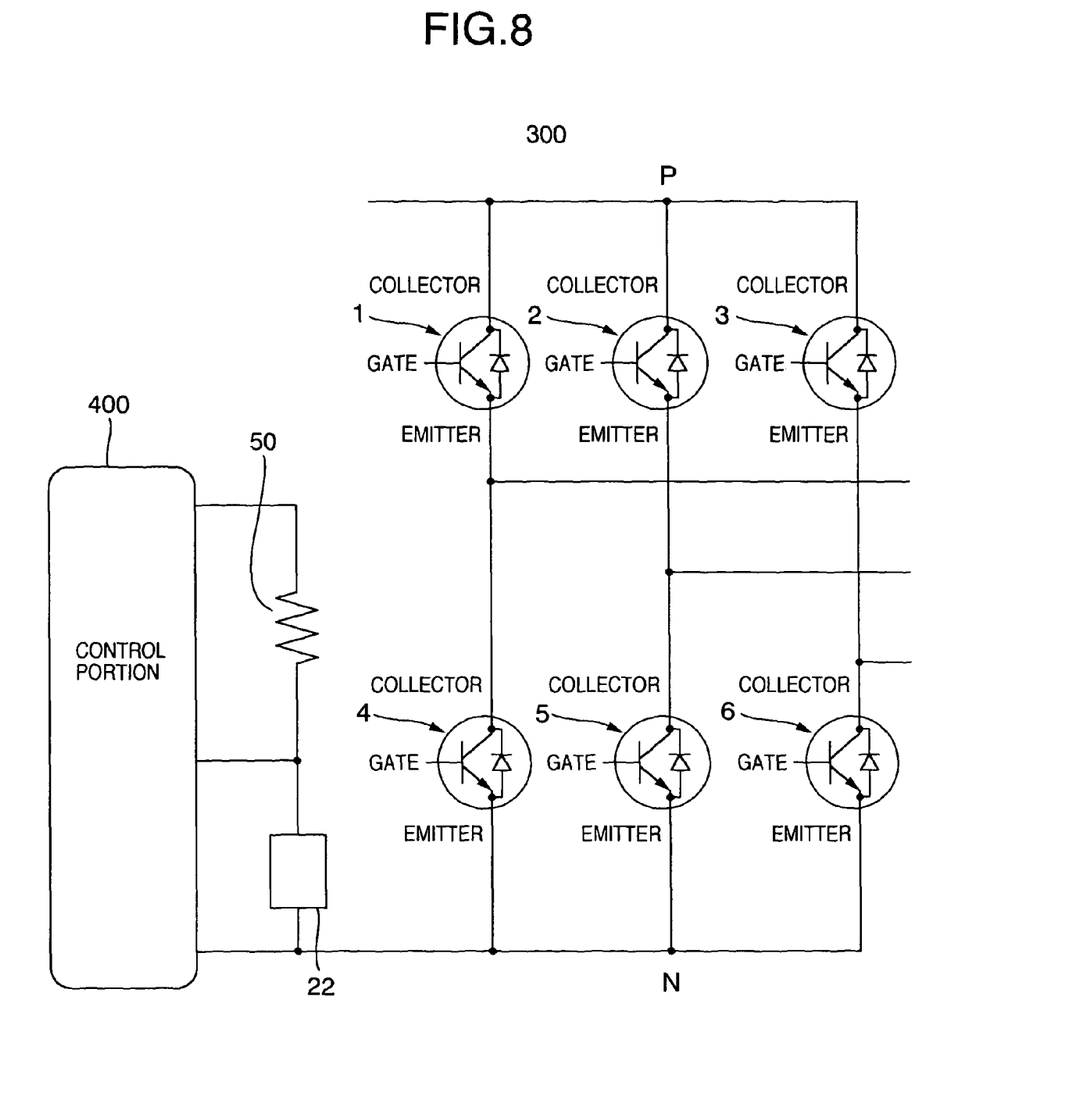
FIG. 8 is a block diagram of the power inverting portion, a power rectifying portion and a control portion to which the temperature detection devices are connected.

In this case, the power inverting portion 300 is controlled by a switching signal supplied from the control portion 400 so that the electric potential as the reference used by the power inverting portion 300 and the control portion 400 is identically the electric potential of a DC −terminal N in FIG. 8. Therefore, in this case, it is the electric potential of the emitter terminals of the power semiconductor devices 4, 5 and 6.

Thus, as shown in FIGS. 10 and 11, if the temperature detection device 22 is placed in the proximity to an emitter terminal 27 and the power semiconductor device in this case is one of the power semiconductor devices 4, 5 and 6 in FIG.

6, the electric potential of the emitter terminal 27 is the same as the electric potential used as the reference by the control portion 400. Therefore, the detection result of the temperature detection device 22 can be inputted directly to the control portion 400. Here, FIG. 8 shows a circuit configuration example in this instance in the case where the temperature detection device 22 is the thermistor. In FIG. 8, a resistor 50 and the temperature detection device 22 are a voltage divider, where the DC –terminal N is the reference as with the control portion 400.

If the power semiconductor device shown in FIGS. 10 and 11 is one of the power semiconductor devices 1, 2 and 3 in FIG. 6, the electric potential of the emitter terminal 27 shows the same change as the electric potential of one of the phases of three-phase AC power U, V and W. In this case, voltage becomes higher than the electric potential used as the reference by the control portion 400.

Therefore, in this case, it is necessary to provide an insulation distance stipulated by a specification (the UL standard for instance) required of the power conversion apparatus between the temperature detection device 22 and the emitter terminal 27. In this case, it becomes difficult to place the temperature detection device 22 in the proximity to the emitter terminal 27 of the power semiconductor device 1, 2 or 3.

Given this factor, it is necessary in this case to place the temperature detection device 22 in the proximity to the emitter terminal 27 of the power semiconductor device 1, 2 or 3 to allow more accurate detection of the temperature so as to input a detection output of the temperature detection device 22 to the control portion 400 in an electrically isolated state by using a device such as a photo coupler.

Furthermore, it is also necessary in this case to note that the output of the temperature detection device 22 is apt to be influenced by noise because the electric potential of the emitter terminal 27 of the power semiconductor device 1, 2 or 3 is fluctuating hard during operation of the power conversion apparatus.

Next, in the case of placing the temperature detection device 22 in the proximity to the collector terminal 28 as shown in FIGS. 3 and 4, the electric potential of the collector terminal 28 of the power semiconductor device 1, 2 or 3 in FIG. 6 becomes as high-voltage as a DC +terminal P.

Consequently, in such a case of placing the temperature detection device 22 in the proximity to the collector terminal 28 of the power semiconductor device 1, 2 or 3, it is necessary to provide the insulation distance stipulated by the specification to be obtained by the power conversion apparatus between the temperature detection device 22 and the collector terminal 28.

In the case of having such an insulation distance, it becomes difficult to place the temperature detection device 22 in the proximity to the collector terminal 28 of the power semiconductor device 1, 2 or 3.

It is also necessary in this case to place the temperature detection device 22 in the proximity to the collector terminal 28 of the power semiconductor device 1, 2 or 3 to allow more accurate detection of the temperature so as to input the detection output of the temperature detection device 22 to the control portion 400 in the electrically isolated state by using the device such as the photo coupler.

If the power semiconductor device shown in FIGS. 3 and 4 is one of the power semiconductor devices 4, 5 and 6 in FIG. 6, the electric potential of the collector terminal 28 shows the same change as the electric potential of one of the phases of three-phase AC power U, V and W. In this case, the voltage becomes higher than the electric potential used as the reference by the control portion 400.

Therefore, in this case, it is necessary to provide the insulation distance stipulated by the specification required of the power conversion apparatus between the temperature detection device 22 and the collector terminal 28. In this case, it becomes difficult to place the temperature detection device 22 in the proximity to the collector terminal 28 of the power semiconductor device 4, 5 or 6.

Given this factor, it is necessary in this case to place the temperature detection device 22 in the proximity to the collector terminal 28 of the power semiconductor device 4, 5 or 6 to allow more accurate detection of the temperature so as to input the detection output of the temperature detection device 22 to the control portion 400 in the electrically isolated state by using the device such as the photo coupler.

Furthermore, it is also necessary in this case to note that the output of the temperature detection device 22 is apt to be influenced by the noise because the electric potential of the collector terminal 28 of the power semiconductor device 4, 5 or 6 is fluctuating hard during the operation of the power conversion apparatus.

Therefore, as to the embodiment of the present invention, it is desirable to have the configuration as shown in FIG. 10 wherein the temperature detection device 22 is placed in the proximity to the emitter terminal 27 of the power semiconductor devices 4 to 6, and the power semiconductor device having the temperature detection device 22 placed in the proximity to its emitter terminal 27 becomes the power semiconductor device 2, that is, the component 8 shown in FIG. 6.

The embodiment uses the power semiconductor device having the collector terminal and emitter terminal. Even in the case of the semiconductor device having another terminal name, an advantage of the present invention remains unchanged in that the temperature of the power semiconductor device can be detected by placing the temperature detection device in the proximity to the terminal close to the junction of the power semiconductor device.

The embodiment describes the case of one temperature detection device. However, the intent of the present invention remains unchanged even if a number of them are separately placed in the proximity to each of the power semiconductor devices.

Furthermore, the embodiment describes the power conversion apparatus capable of supplying AC power of variable voltage and variable frequency to an AC motor. Even if it is not the power conversion apparatus capable of supplying the AC power of variable voltage and variable frequency to the AC motor, however, the advantage of the temperature detection of the power semiconductor device of the present invention remains unchanged in the case of a power conversion circuit using the power semiconductor device.

The above describes that the temperature detection device is placed in the proximity to the terminal of the semiconductor device. As for the degree of the proximity, it is possible, by actual investigation, to detect the temperature rise of the semiconductor device at approximately 10 mm and perform a desired process such as the protecting operation. As for a product, the temperature detection device is placed at a distance of approximately 3 mm in consideration of safety, the placement of the devices on the circuit board, design of the circuit pattern, miniaturization and so on besides time required for detection of the temperature rise.

However, the concrete distance as to the proximity is not limited to the above-mentioned 10 mm and 3 mm, but may be another value as long as it is the distance allowing detection of a temperature change in such as the junction of the semiconductor device. For instance, it is also possible to render it as 15 mm to 30 mm. In this case, however, the distance is larger than 10 mm and 3 mm and speed of the heat conduction on the circuit board changes. Therefore, measures may be taken in consideration of it, such as reducing a determination value of a detected temperature of the temperature detection device or changing a resolution on detecting the temperature change so as to allow the control portion to detect the temperature change of such as the semiconductor device.

As the distance is increased such as 15 mm to 30 mm, the time required to conduct the heat to the temperature detection device and to detect the temperature change becomes longer. Therefore, in the case where a delay in detection time is a problem, it is desirable to render the distance within approximately 10 mm. In the case of miniaturizing the circuit board when constituting the power conversion apparatus and so on, it is desirable to render the distance within approximately 3 mm. It is also possible, as a matter of course, to render it closer and connect the temperature detection device directly to the terminal and circuit pattern as described above.

According to the embodiment of the present invention, the temperature detection device is mounted on the circuit board. Therefore, the embodiment no longer requires the area for the temperature detection device in the cooling fin, the components for detecting the temperature of the power semiconductor device while insulating it electrically from the cooling fin and for conveying the detection result to another substrate, and the man-hours for wiring.

Thus, according to the embodiment of the present invention, it is possible to provide the function of thermal protection to the semiconductor device inexpensively, miniaturize the power conversion apparatus and reduce assembly time.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A power conversion apparatus comprising:
a power rectifying portion,
a smoothing portion, and
a power inverting portion including a plurality of power semiconductor devices to provide 3-phase AC power as an output to a load, a cooling fin to which the power semiconductor devices are attached, a circuit board mounted on the cooling fin, and a thermistor mounted on the circuit board to provide a detection output of temperature measured by said thermistor,
wherein the thermistor is directly connected to a pattern wiring which is formed on the circuit board and is electrically connected to an emitter terminal or a collector terminal of one of the power semiconductor devices, and
a photo coupler connected between the detection output of the thermistor and a control circuit for determining a temperature of the thermistor from the detection output and for controlling electric power applied to the power inverting portion, to provide the detection output of the thermistor to the control circuit in an electrically isolated state.

2. The power conversion apparatus according to claim 1, further comprising a control portion, wherein an electric potential used as a reference of the control portion is equal to an electric potential of the emitter terminal of the one of the power semiconductor devices.

3. The power conversion apparatus according to claim 2, wherein:
the cooling fin is mounted on the power conversion apparatus so that mounting faces of the power semiconductor devices are vertical when the power conversion apparatus is put in a state of use, and
the thermistor is directly connected to the pattern wiring which is formed on the circuit board and is electrically connected to the emitter terminal or the collector terminal of the one of the power semiconductor devices, in the vicinity of the emitter terminal or the collector terminal of the one of the power semiconductor devices, which one of the power semiconductor devices is vertically highest on in the power semiconductor devices and is arranged centrally in a horizontal direction in the power semiconductor devices, when the power conversion apparatus is put in the state of use.

4. A method of controlling a power semiconductor device of power conversion apparatus including a power rectifying portion, a smoothing portion, and a power inverting portion including a plurality of power semiconductor devices to provide 3-phase AC power as an output to a load, a cooling fin to which the power semiconductor devices are attached, a circuit board mounted on the cooling fin, and a thermistor mounted on the circuit board to provide a detection output of temperature measured by said thermistor, said method comprising:
directly connecting the thermistor to a pattern wiring which is formed on the circuit board and which is electrically connected to an emitter terminal or a collector terminal of one of the power semiconductor devices; and
connecting a photo coupler between the detection output of the thermistor and a control circuit for determining a temperature of the thermistor from the detection output and for controlling electric power applied to the power inverting portion, to provide the detection output of the thermistor to the control circuit in an electrically isolated state.

5. The method according to claim 4, wherein the power conversion apparatus further comprises a control portion, said method further comprising using an electric potential as a reference of the control portion equal to an electric potential of the emitter terminal or the collector terminal of the one of the power semiconductor devices.

6. The method according to claim 5, further comprising:
mounting the cooling fin on the power conversion apparatus so that mounting faces of the power semiconductor devices are vertical when the power conversion apparatus is put in a state of use, and
directly connecting the thermistor connected to the pattern wiring which is formed on the circuit board and is electrically connected to the emitter terminal or the collector terminal of the one of the power semiconductor devices, in the vicinity of the emitter terminal or the collector terminal of the one of the power semiconductor devices, which one of the power semiconductor devices is vertically highest on in the power semiconductor devices and is arranged centrally in a horizontal direction in the power semiconductor devices, when the power conversion apparatus is put in the state of use.

* * * * *